(12) United States Patent
Chen

(10) Patent No.: US 10,965,287 B2
(45) Date of Patent: Mar. 30, 2021

(54) REPLACEABLE KEY STRUCTURE

(71) Applicants: DEXIN ELECTRONIC LTD., Guangdong (CN); DEXIN CORPORATION, New Taipei (TW)

(72) Inventor: Yi-Shun Chen, New Taipei (TW)

(73) Assignees: DEXIN ELECTRONIC LTD., Guangdong (CN); DEXIN CORPORATION, New Taipei (TW)

( * ) Notice: Subject to any disclaimer, the term of this patent is extended or adjusted under 35 U.S.C. 154(b) by 274 days.

(21) Appl. No.: 16/226,848

(22) Filed: Dec. 20, 2018

(65) Prior Publication Data
US 2020/0204178 A1    Jun. 25, 2020

(51) Int. Cl.
| | | |
|---|---|---|
| *H01H 9/00* | (2006.01) |
| *H03K 17/972* | (2006.01) |
| *G06F 3/023* | (2006.01) |
| *H01H 13/803* | (2006.01) |
| *H01H 13/7073* | (2006.01) |
| *H01H 13/7057* | (2006.01) |

(52) U.S. Cl.
CPC .......... *H03K 17/972* (2013.01); *G06F 3/023* (2013.01); *H01H 13/7057* (2013.01); *H01H 13/7073* (2013.01); *H01H 13/803* (2013.01)

(58) Field of Classification Search
CPC .. H03K 17/972; G06F 3/023; H01H 13/7057; H01H 13/7073; H01H 13/803
USPC ........................................................ 335/205
See application file for complete search history.

(56) References Cited

U.S. PATENT DOCUMENTS

| | | | | | |
|---|---|---|---|---|---|
| 3,588,875 | A | * | 6/1971 | Gabor ................... | H03K 17/98 |
| | | | | | 341/90 |
| 3,678,424 | A | * | 7/1972 | Iwashima .............. | H01H 13/70 |
| | | | | | 335/206 |
| 3,711,685 | A | * | 1/1973 | Castle ................... | H01H 3/122 |
| | | | | | 235/145 R |
| 3,736,397 | A | * | 5/1973 | Pedersen ............... | H01H 13/70 |
| | | | | | 200/318.1 |

(Continued)

FOREIGN PATENT DOCUMENTS

| | | |
|---|---|---|
| CN | 203386635 U | 1/2014 |
| CN | 204442328 U | 7/2015 |

(Continued)

*Primary Examiner* — Shawki S Ismail
*Assistant Examiner* — Lisa N Homza
(74) *Attorney, Agent, or Firm* — Li & Cai Intellectual Property (USA) Office

(57) ABSTRACT

A replaceable key structure includes a key holder and a circuit board. The key holder is disposed above a circuit board. The key holder is formed with a mounting slot for selectively receiving a first key module or a second key module therein. A magnetic sensor and a contact connector are disposed on the circuit board positionally corresponding to the mounting slot of the key holder. The first key module has a shaft, and a magnetic element disposed on the bottom of the shaft. The magnetic sensor can output an analog signal when the magnetic element approaches. The second key module has a trigger switch which has two electrical terminals disposed on the bottom surface of the second key module. When the second key module is installed in the mounting slot, the electrical terminals can be electrically connected to the contact connector.

4 Claims, 7 Drawing Sheets

(56) References Cited

U.S. PATENT DOCUMENTS

| | | | | |
|---|---|---|---|---|
| 3,741,512 A * | 6/1973 | Olsson | B65G 1/07 | 248/585 |
| 3,787,837 A * | 1/1974 | Allen | B41J 5/08 | 341/31 |
| 3,797,630 A * | 3/1974 | Zilkha | H01H 13/02 | 400/479.1 |
| 3,829,632 A * | 8/1974 | Klehm, Jr. | H01H 13/705 | 200/5 A |
| 3,916,150 A * | 10/1975 | Abernethy | H01H 3/122 | 200/344 |
| 3,940,578 A * | 2/1976 | Pointon | H01H 13/12 | 200/5 A |
| 3,962,556 A * | 6/1976 | Kravchuck | B41J 5/12 | 200/5 R |
| 4,367,380 A * | 1/1983 | Larson | H01H 13/705 | 200/5 R |
| 4,433,225 A * | 2/1984 | Cowles | H01H 3/125 | 200/344 |
| 4,454,562 A * | 6/1984 | Bush | H01H 13/705 | 200/342 |
| 4,467,160 A * | 8/1984 | Murmann | H01H 13/12 | 200/536 |
| 4,535,210 A * | 8/1985 | Shedore | H01H 3/122 | 200/344 |
| 4,626,639 A * | 12/1986 | Bradford | H01H 3/122 | 200/344 |
| 4,902,862 A * | 2/1990 | Oelsch | H01H 3/125 | 200/344 |
| 5,278,372 A * | 1/1994 | Takagi | H01H 3/125 | 200/344 |
| 5,278,374 A * | 1/1994 | Takagi | H01H 3/125 | 200/344 |
| 5,280,147 A * | 1/1994 | Mochizuki | H01H 3/125 | 200/344 |
| 5,488,210 A * | 1/1996 | Shigetaka | H01H 3/125 | 200/344 |
| 5,746,308 A * | 5/1998 | Lin | H01H 3/122 | 200/344 |
| 5,986,227 A * | 11/1999 | Hon | H01H 3/125 | 200/344 |
| 6,087,604 A * | 7/2000 | Suga | H01H 3/125 | 200/344 |
| 6,183,150 B1 * | 2/2001 | Kao | H01H 3/125 | 200/344 |
| 6,297,461 B1 * | 10/2001 | Kamishima | G06F 1/1616 | 200/5 A |
| 6,382,856 B2 * | 5/2002 | Hu | H01H 3/125 | 400/490 |
| 6,570,113 B2 * | 5/2003 | Yu | H01H 3/125 | 200/344 |
| 6,653,585 B2 * | 11/2003 | Chun | H01H 3/125 | 200/341 |
| 6,706,986 B2 * | 3/2004 | Hsu | H01H 3/125 | 200/344 |
| 6,781,077 B2 * | 8/2004 | Olodort | H01H 3/125 | 200/344 |
| 7,173,200 B2 * | 2/2007 | Yoneyama | H01H 3/125 | 200/344 |
| 7,310,054 B2 | 12/2007 | Wu | | |
| 9,098,250 B2 * | 8/2015 | Doi | G06F 1/1616 | |
| 9,455,096 B2 * | 9/2016 | Chen | H01H 3/125 | |
| 10,276,328 B1 * | 4/2019 | Cheng | H01H 13/52 | |
| 2019/0129515 A1 * | 5/2019 | Morrison | H01H 13/84 | |

FOREIGN PATENT DOCUMENTS

| | | |
|---|---|---|
| TW | 200719370 A | 5/2007 |
| TW | M539079 U | 4/2017 |

* cited by examiner

REPLACEABLE KEY STRUCTURE

CROSS-REFERENCE TO RELATED PATENT APPLICATION

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a replaceable key structure, and more particularly to a replaceable key structure for a computer keyboard or game keyboard.

BACKGROUND OF THE DISCLOSURE

Electronic equipment, such as computers, game consoles and multimedia players, are usually equipped with a keyboard as an input device. The keyboard usually has a plurality of key modules for inputting texts, or function keys for inputting operation instructions.

Conventional key modules of the keyboard are generally divided into mechanical keyboards or membrane keyboards. The key module of either type of keyboard usually has a trigger switch, and when a keycap of the key module is pressed, the trigger switch enters a closed-circuit state. Alternatively, when the keycap of the key module is not pressed, the trigger switch is in an open-circuit state.

Since all the conventional key module of keyboards can only output a digital signal by the trigger switch, the conventional key module is only suitable for outputting texts or producing a digital control signal. When a user uses a keyboard to process a game, the key module of the keyboard can only process actions such as controlling directions, inputting commands, or pulling a trigger. Alternatively, when a user uses a keyboard to operate a software, the keyboard can only process actions such as inputting text or numbers, moving the cursor, or inputting a control command by function keys.

However, many games need to be processed with analog signals, such as for batting a ball, controlling the throttle of flying games or racing games, or jumping a height, and the conventional keyboard cannot process the above-mentioned controls. An additional gamepad or a specialized game controller must be used to process the above-mentioned actions.

In addition, computer image editing or beautification software usually have many commands or functions needing fine adjustments or fine scale controls, such as image exposure value, transparency, tone, and saturation. However, the available keyboards only can provide digital control, and additional equipment is needed, such as a mouse or a gamepad, to support the processing of the above-mentioned commands or functions.

For the reasons outlined above, the key module of the conventional keyboard can only output digital signals, so that the control functions in games or software are limited. Therefore, how the drawbacks associated with the conventional keyboard can be addressed through structural or manufactural improvements has become an important issue in the art.

SUMMARY OF THE DISCLOSURE

In response to the above-referenced technical inadequacies, the present disclosure provides a replaceable key structure for solving issues associated with conventional key modules of keyboard, which can only output digital signals and are not able to output analog signals for controls in a computer game or software.

In one aspect, the present disclosure provides a replaceable key structure, which includes a key holder and a circuit board. The key holder is formed with a mounting slot, and the mounting slot is configured to receive a first key module or a second key module selectively. The circuit board is disposed under the key holder, and has a magnetic sensor and a contact connector which are positionally corresponded to the mounting slot. The first key module and the second key module respectively have a shaft and a spring. The shaft is movable from a topmost position to a bottommost position when an external force is applied, and the shaft is capable of returning to the topmost position by a recovering force of the spring when the external force is removed. The first key module further includes a magnetic element, the magnetic element is connected to a bottom end of the shaft, and the magnetic sensor is positionally corresponded to the magnetic element. When the magnetic element approaches the magnetic sensor following a displacement of the shaft of the first key module, the magnetic sensor outputs an analog signal by inducing a magnetic field of the magnetic element, and a strength of the analog signal is changed according to a distance between the magnetic element and the magnetic sensor. The second key module further includes a trigger switch, and the trigger switch is turned on to generate a digital signal when the shaft of the second key module is pushed downward to a triggering position by an external force. The trigger switch has at least one contacting portion disposed on a bottom of the second key module, and the at least one contacting portion is positionally corresponded to the contact connector; when the second key module is disposed in the mounting slot, the contacting portion is capable of contacting the contact connector for transmitting the digital signal to the circuit board.

In certain embodiments, the first key module and the second key module respectively further include a key housing, and sides of the key housing are respectively formed with a plurality of engaging members for fixedly engaging the first key module or the second key module in the mounting slot.

In certain embodiments, the magnetic element of the first key module is a post-shaped magnet, a central axis of the magnetic element and a reciprocating direction of the shaft of the first key module are parallel to each other, and the magnetic element is disposed on the bottom end of the shaft.

In certain embodiments, the magnetic sensor is a Hall sensor, and a position of the magnetic sensor on the circuit board is positionally corresponded to the magnetic element.

In certain embodiments, the trigger switch is disposed on one side of the shaft of the second key module, and has a first electrical terminal and a second electrical terminal, wherein the first electrical terminal has an elastic portion, and the elastic portion is capable of contacting the second electrical terminal to make the trigger switch be in a closed-circuit state; wherein the second key module has a triggering portion disposed on one side of the shaft close to the trigger switch. When the shaft of the second key module is positioned at the topmost position, the triggering portion is capable of contacting the elastic portion and the elastic portion is forced to separate from the second electrical terminal to make the trigger switch be in an open-circuit state. When the shaft of the second key module is positioned at the triggering position, the triggering portion is capable of separating from the elastic portion and contacts with the second electrical terminal, to make the trigger switch be in a closed-circuit state.

In certain embodiments, the first electrical terminal and the second electrical terminal respectively have an end extending beyond a bottom of the key housing, and the ends of the first electrical terminal and the second electrical terminal are respectively formed with the contacting portion. The contact connector is placed on the circuit board and positionally corresponds to the trigger switch, and the contact connector has two circuit contacts which are positionally corresponded to the contacting portions of the first electrical terminal and the second electrical terminal, respectively. When the second key module is disposed in the mounting slot, the two contacting portions are capable of contacting the two circuit contacts, so that the trigger switch is electrically connected to the contact connector.

In one aspect, the present disclosure provides a replaceable key structure, which includes a key holder, a circuit board, a magnetic sensor, and a contact connector. The key holder has a mounting slot. The mounting slot is configured to receive a third key module selectively. The circuit board is disposed under the key holder. A magnetic sensor is mounted on the circuit board and positionally corresponds to the mounting slot. A contact connector is mounted on the circuit board and positionally corresponds to the mounting slot. The third key module has a shaft and a spring. The shaft is movable from a topmost position to a bottommost position when an external force is applied, and the shaft is capable of returning to the topmost position by a recovering force of the spring when the external force is removed. The third key module has a key housing, and sides of the key housing are respectively are formed with a plurality of engaging members for fixedly engaging the third key module in the mounting slot. The third key module further includes a magnetic element, and the magnetic element is connected to a bottom end of the shaft. The magnetic sensor is positionally corresponded to the magnetic element. When the magnetic element approaches the magnetic sensor following a displacement of the shaft of the third key module, the magnetic sensor outputs an analog signal by inducing a magnetic field of the magnetic element, and a strength of the analog signal is changed following a distance between the magnetic element and the magnetic sensor. The third key module includes a trigger switch. The trigger switch is turned on to generate a digital signal when the shaft of the third key module is pushed downward to a triggering position by an external force. The trigger switch has at least one contacting portion disposed on a bottom of the third key module, and the at least one contacting portion is positionally corresponded to the contact connector. When the second third key module is disposed in the mounting slot, the contacting portion is capable of contacting the contact connector for transmitting the digital signal to the circuit board.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
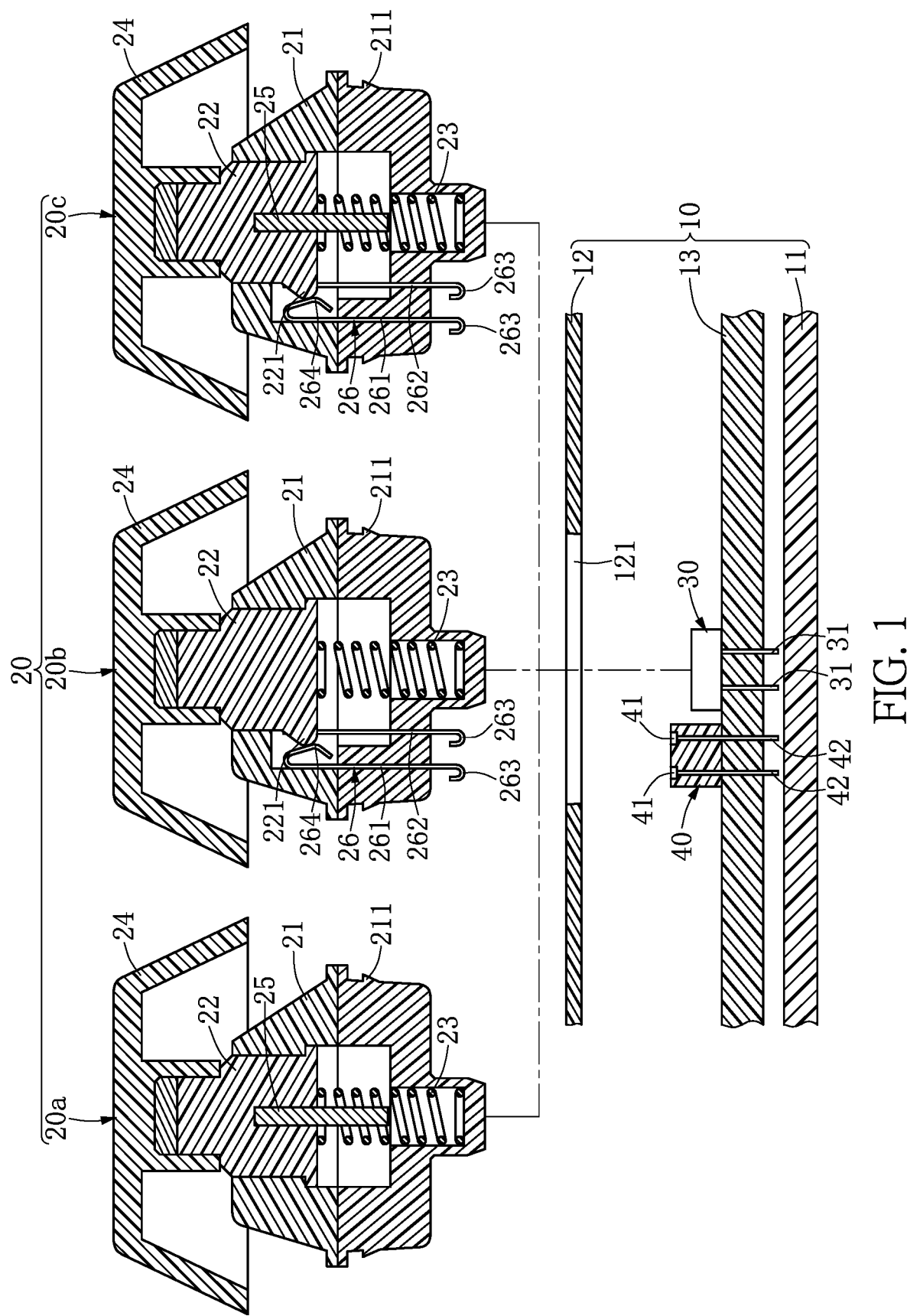
FIG. 1 is an exploded cross-sectional view of a replaceable key structure of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, a keyboard is equipped with a replaceable key structure according to the present disclosure. The keyboard includes a keyboard seat 10. The keyboard seat 10 has a key holder 12, and a circuit board 13. The key holder 12 is formed with a plurality of mounting slots 121 for receiving a plurality of key modules 20 mounted on the key holder 12.

The key modules 20 include a first key module 20a, and a second key module 20b. In this embodiment, the first key module 20a is a key module for outputting an analog signal, and the second key module 20b is used to output a digital signal. The first key module 20a and the second key module 20b are selectively disposed in the mounting slot 121 of the key holder 12. Therefore, a user can decide to dispose the first key module 20a or the second key module 20b in the mounting slot 121 for respectively outputting an analog signal or a digital signal depending on particular implementations.

As shown in FIG. 1, the present disclosure includes a magnetic sensor 30 and a contact connector 40 that are disposed on the circuit board 13 and that are positionally corresponded to the mounting slot 121 of the key holder 12. The magnetic sensor 30 could be a Hall sensor. The magnetic sensor 30 cooperates with the first key module 20a for outputting an analog signal, and has a plurality of analog-signal pins 31. The analog-signal pins 31 are soldered on the circuit board 13, so that the magnetic sensor 30 is electrically connected to the circuit board 13. The contact connector 40 is disposed at one side of the magnetic sensor 30. The contact connector 40 has a plurality of circuit contacts 41 and a plurality of conducting pins 42 respectively connected to the circuit contacts 41. The conducting pins 42 are soldered on the circuit board 13, so that the contact connector 40 is electrically connected to the circuit board 13. The contact connector 40 cooperates with the second key module 20b to transmit a digital signal generated by the second key module 20b to the circuit board 13.

Figure 2:
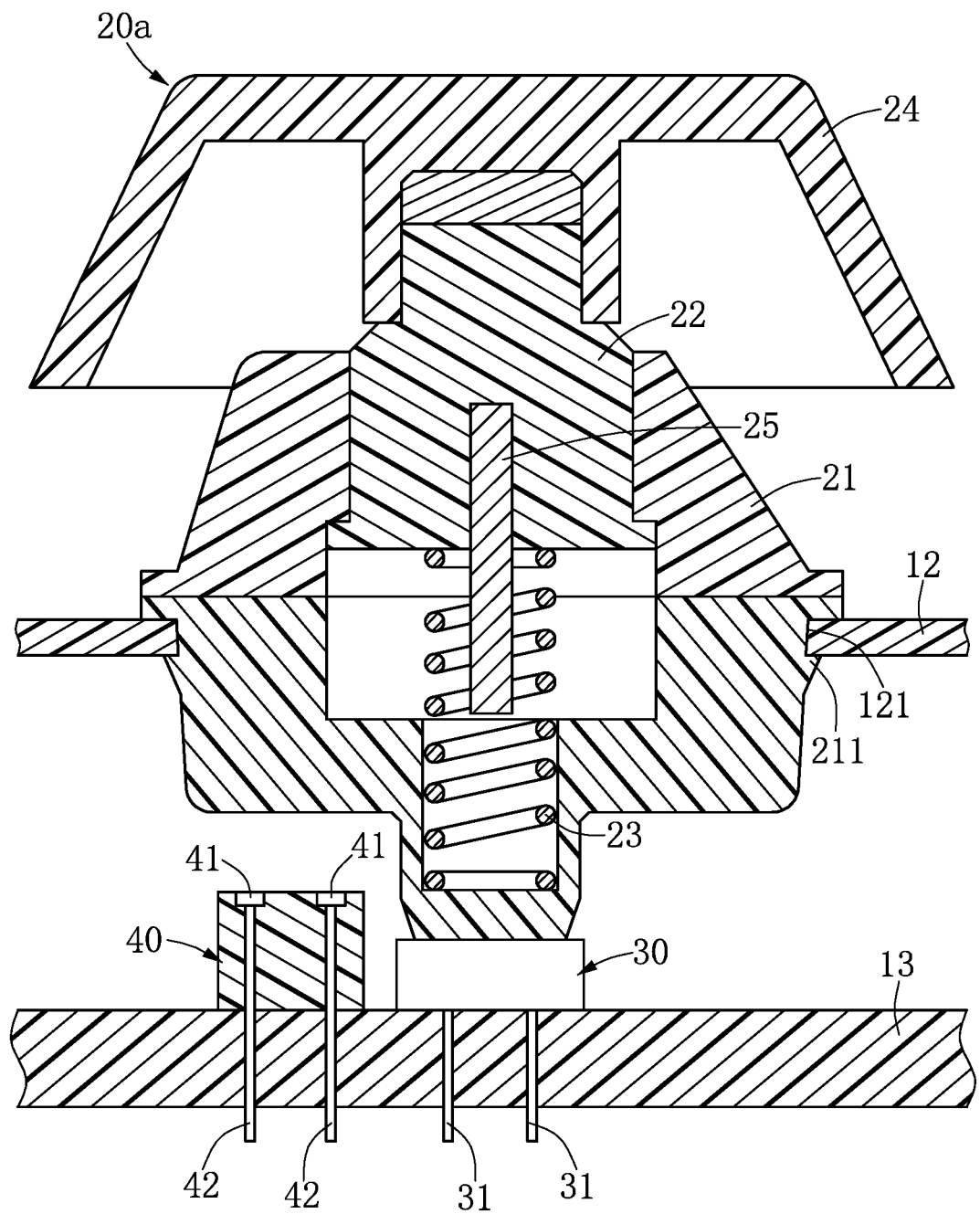
FIG. 2 is an assembled cross-sectional view of the replaceable key structure of the present disclosure, wherein a first key module is disposed in a mounting slot, and a shaft is positioned at a topmost position.
Figure 3:
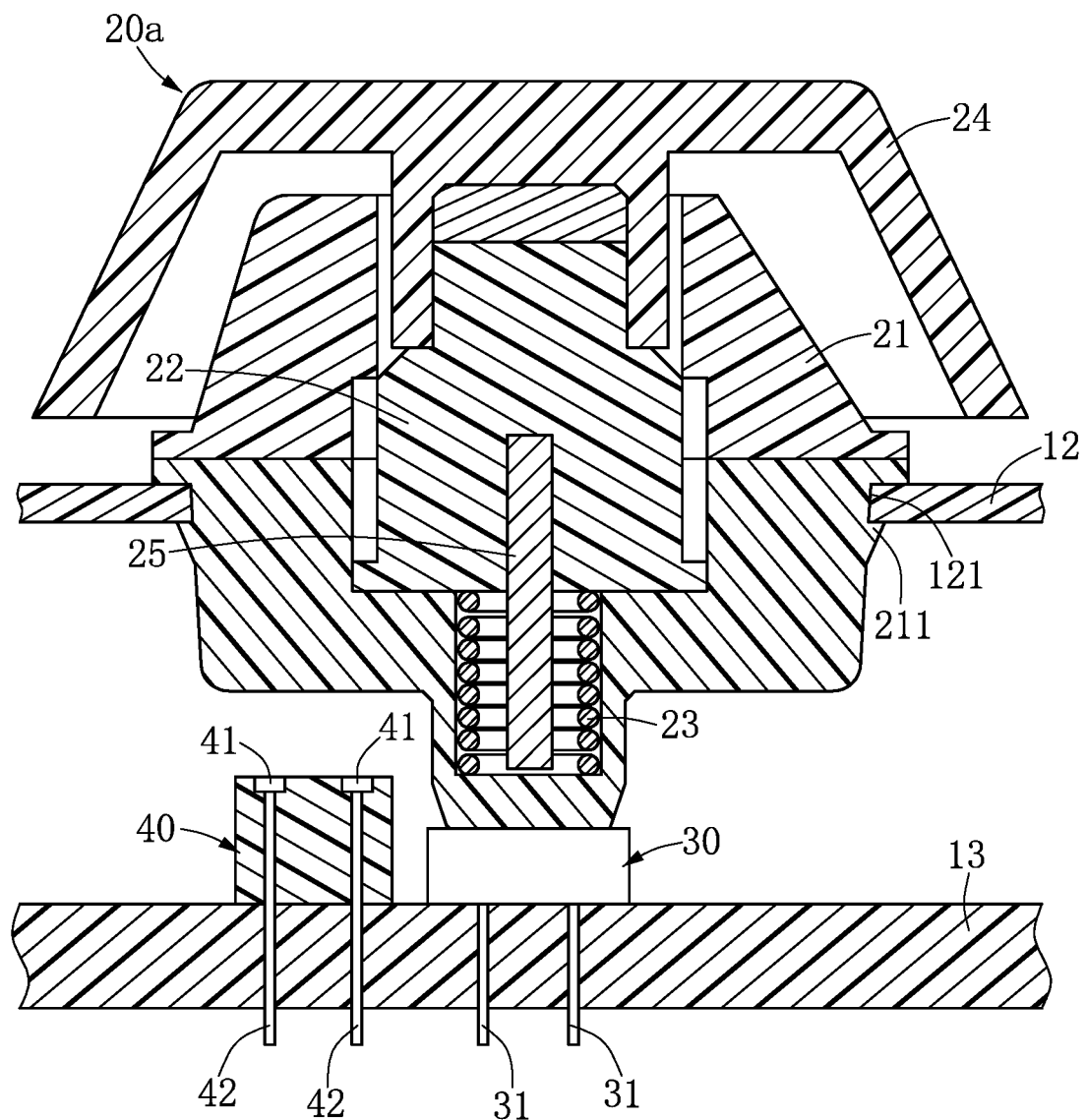
FIG. 3 is an assembled cross-sectional view of the replaceable key structure of the present disclosure, wherein the first key module is disposed in the mounting slot, and the shaft is positioned at a bottommost position.

Reference is made to FIG. 2 and FIG. 3. In this embodiment, the first key module 20a has a key housing 21. A bottom of the key housing 21 has a shape with a size matching with the mounting slot 121 of the key holder 12, so that the first key module 20a can be inserted in the mounting slot 121. The key housing 21 further has a plurality of engaging members 211 formed on sides thereof. When the first key module 20a is inserted in the mounting slot 121, the engaging members 211 are engaged with the edges around the mounting slot 121, and the first key module 20a is detachably mounted in the mounting slot 121 of the key holder 12.

The first key module 20a further has a shaft 22, and the shaft 22 is movably disposed in the key housing 21 along a central axis thereof in an up and down manner. An upper end of the shaft 22 protrudes outside a top surface of the key housing 21, and can be assembled with a keycap 24 for a user's finger to press thereon. A spring 23 is arranged at another end of the shaft 22 opposite to the keycap 24. When the shaft 22 is pressed by a user's finger, the shaft 22 is movable toward the spring 23, and the spring 23 is compressed by the bottom end of the shaft 22. When the force from user's finger is withdrawn, the shaft 22 can be pushed toward the keycap 24 by the potential elasticity of the spring 23. Thus, the shaft 22 and keycap 24 can move forward and backward between a topmost position and a bottommost position.

The first key module 20a has a magnetic element 25 disposed on one end of the shaft 22 opposite to the keycap 24. In this embodiment, the magnetic element 25 is a post-shaped magnet, and a central axis of the magnetic element 25 and a reciprocating direction of the shaft 22 of the first key module 20a are parallel to each other. In this embodiment, the magnetic element 25 is disposed on the bottom end of the shaft 22. When the shaft 22 moves back and forth, the magnetic element 25 can move together with the shaft 22.

As shown in FIG. 2 and FIG. 3, the magnetic sensor 30 is disposed on the circuit board 13 at a position corresponding to that of the magnetic element 25 of the first key module 20a. When the magnetic element 25 is moved along with the shaft 22 back and forth, a distance between the magnetic element 25 and the magnetic sensor 30 is changed accordingly. In this embodiment, the magnetic sensor 30 could be a Hall sensor. When the magnetic element 25 approaches the magnetic sensor 30, the magnetic sensor 30 can sense a magnetic field generated by the magnetic element 25, so as to output an analog signal. In addition, when the distance between the magnetic element 25 and the magnetic sensor 30 is changed, a voltage of the analog signal outputted from the magnetic sensor 30 is accordingly changed. Therefore, the first key module 20a and the magnetic sensor 30 could work in coordination to provide a function similar to that of a pressure sensitive button of a gamepad. Therefore, the user can control a strength of the analog signal outputted from the magnetic sensor 30 by pressing the keycap 24 with different keystroke depths.

Figure 4:
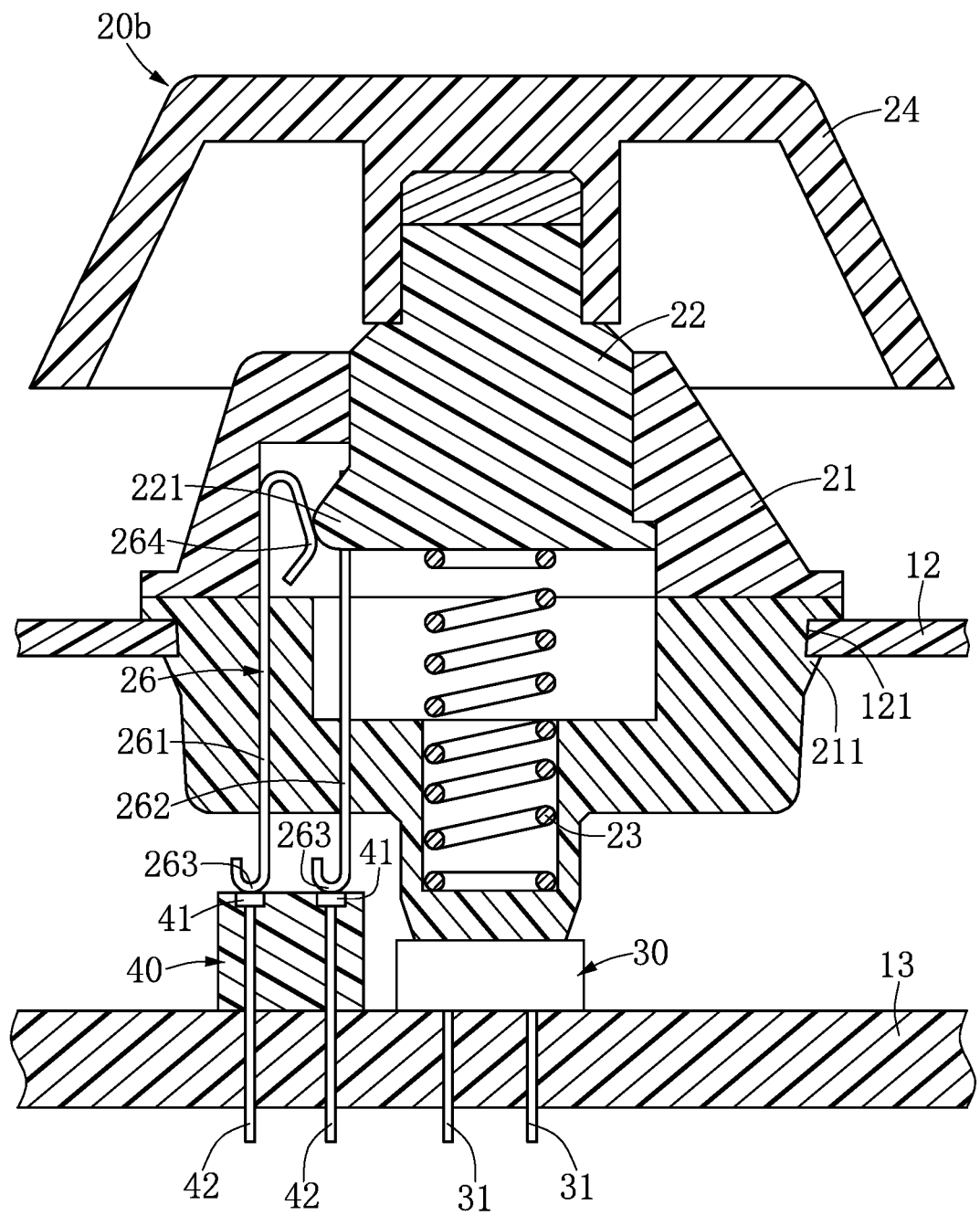
FIG. 4 is an assembled cross-sectional view of the replaceable key structure of the present disclosure, wherein a second key module is disposed in the mounting slot, and the shaft is positioned at the topmost position.
Figure 5:
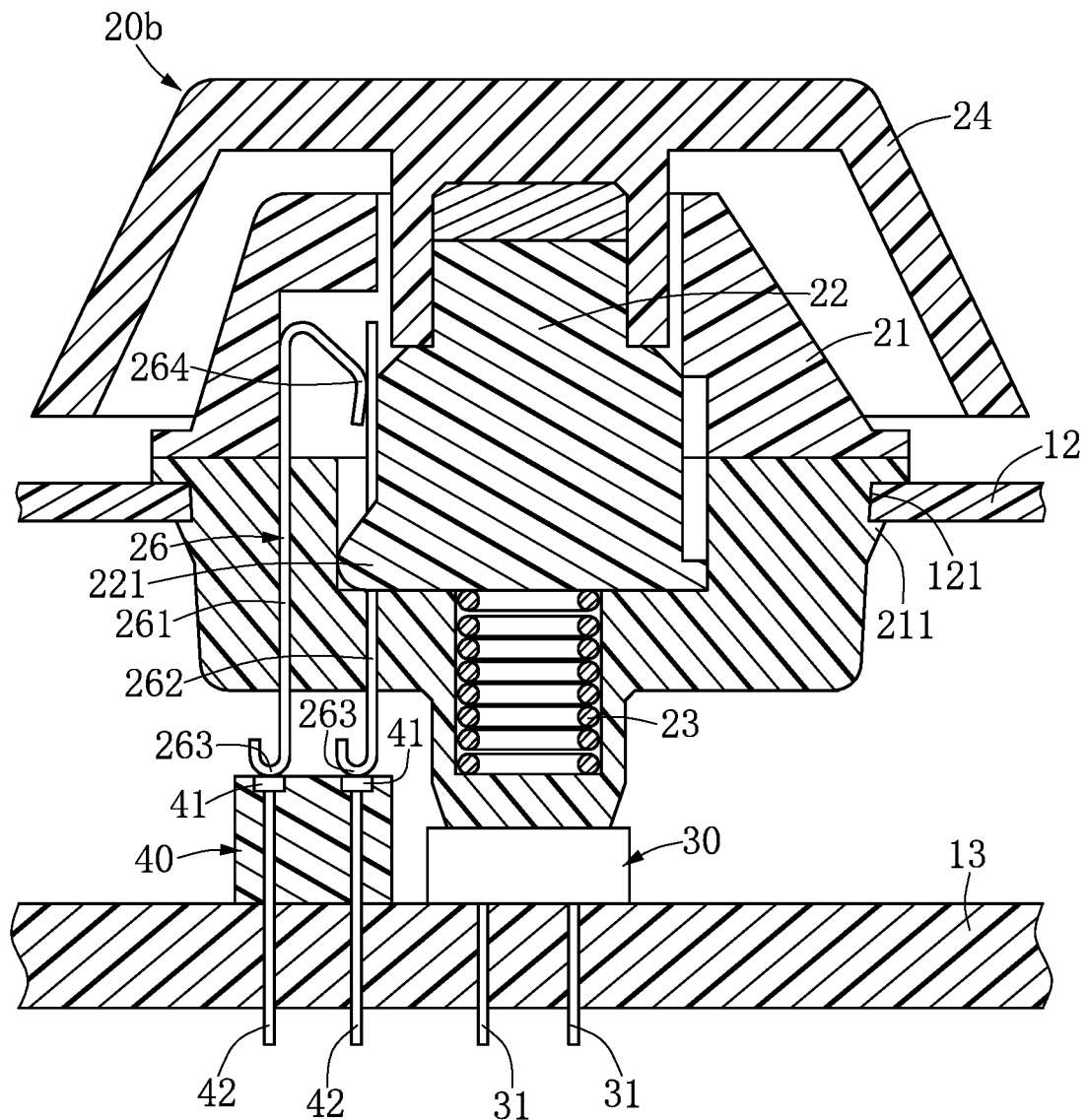
FIG. 5 is an assembled cross-sectional view of the replaceable key structure of the present disclosure, wherein the second key module is disposed in the mounting slot, and the shaft is positioned at the bottommost position.

As shown in FIG. 4 and FIG. 5, the second key module 20b can be optionally disposed in the mounting slot 121 of the key holder 12. In a similar way, the second key module 20b has a key housing 21 and a shaft 22. The top end of the shaft 22 can be assembled with a keycap. The key housing 21 of the second key module 20b has a shape with a size which matches with that of the key housing 21 of the first key module 20a. Sides of the key housing 21 are also provided with engaging members 211, so that the second key module 20b can also be detachably mounted in the mounting slot 121 of the key holder 12.

The second key module 20b further includes a trigger switch 26. The trigger switch 26 has a first electrical terminal 261 and a second electrical terminal 262. The first electrical terminal 261 and the second electrical terminal 262 are disposed at one side of the shaft 22 of the key housing 21 parallel to a displacement direction of the shaft 22. The first electrical terminal 261 and the second electrical terminal 262 are parallel to each other. The first electrical terminal 261 and the second electrical terminal 262 respectively have one end extending beyond a bottom of the key housing 21, and are formed with a contacting portion 263, respectively. The circuit contacts 41 of the contact connector 40 positionally correspond to the contacting portion 263 of the first electrical terminal 261 and the contacting portion 263 of the second electrical terminal 262. When the second key module 20b is inserted in the mounting slot 121 of the key holder 12, the contacting portions 263 on ends of the first electrical terminal 261 and second electrical terminal 262 can contact with the circuit contacts 41 of the contact connector 40. Therefore, the first electrical terminal 261 and the second electrical terminal 262 are electrically connected to the contact connector 40.

The first electrical terminal 261 has one end formed with an elastic portion 264, which is opposite to the contacting portion 263. The shaft 22 has a triggering portion 221 formed on one side thereof adjacent to the first electrical terminal 261. The elastic portion 264 of the first electrical terminal 261 is curved elastically. When the triggering portion 221 of the shaft 22 is not in contact with the elastic portion 264 of the first electrical terminal 261, the elastic portion 264 is in contact with the second electrical terminal 262. Therefore, the first electrical terminal 261 is electrically contacted with the second electrical terminal 262, to make the trigger switch 26 be in a closed-circuit state, as shown in FIG. 5. Referring to FIG. 4, after the shaft 22 of the second key module 20b is moved to the topmost position, the triggering portion 221 on one side of the shaft 22 can contact and push the elastic portion 264. Therefore, the elastic portion 264 is bent toward a direction away from the second electrical terminal 262, so that the elastic portion 264 is divided apart from and does not contact the second electrical terminal 262, and so that the trigger switch 26 is in an open-circuit state. Referring to FIG. 5, when the shaft 22 of the second key module 20b is pressed by a user and moves to a triggering position, the triggering portion 221 of the shaft 22 can be separated from the elastic portion 264, and the elastic portion 264 is contacted with the second electrical terminal 262. Therefore, the trigger switch 26 is in a close-circuit state so as to produce a digital signal.

Of particular note is that the triggering position of the shaft 22 is not shown in FIG. 5. The triggering position of the shaft 22 refers to the exact position where, during the movement of the shaft 22 from the topmost position to the bottommost position, the triggering portion 221 of the shaft 22 separates from the elastic portion 264 so that the elastic portion 264 contacts the second electrical terminal 262. Therefore, the triggering position of the shaft 22 is at a position between the topmost position to the bottommost position.

Reference is made to FIG. 1. The present disclosure provides the magnetic sensor 30 and the contact connector 40 which are positionally corresponded to the mounting slot 121 on the circuit board 13 at the same time. In addition, the first key module 20a and the second key module 20b are detachably disposed in the mounting slot 121, respectively. Therefore, the first key module 20a or the second key module 20b can be optionally disposed in the mounting slot 121 of the key holder 12 according to user requirements, so as to output an analog signal or a digital signal.

The present disclosure provides the key holder 12 of the keyboard, which can be formed with at least one mounting slot 121, and includes the magnetic sensor 30 and the contact connector 40 disposed on the circuit board 13 at a position corresponding to the mounting slot 121. Therefore, the present disclosure can optionally include the first key module 20a for outputting an analog signal, or the second key module 20b for outputting a digital signal in the at least one mounting slot 121, according to user requirements in games or software.

When a game player uses the keyboard of the present disclosure to operate a game or software, if an analog signal is needed for control in games or software, the first key module 20a can be disposed in the at least one mounting slot 121 so as to serve as a controlling key for the analog signal. The analog signals outputted by the first key module 20a can serve as control signals in games, such as ball games for controlling the force of serving or batting a ball, racing games for controlling an accelerator, a brake and a steering wheel, aviation games for controlling the throttle and wing flaps, or MMORPG games for controlling the force of attacks. Further, the analog signal outputted by the first key module 20a can serve as control signals in design or beautification software or post-production software for videos to control the brush depth, color adjustments, contrast adjustments, or timeline sliding, so that the user can operate a software with more precision.

Alternatively, if a game or software does not need analog signals for control, the second key module 20b can be disposed in the at least one the mounting slot 121, so that the key in the at least one mounting slot 121 can be used to output a digital signal.

Figure 6:
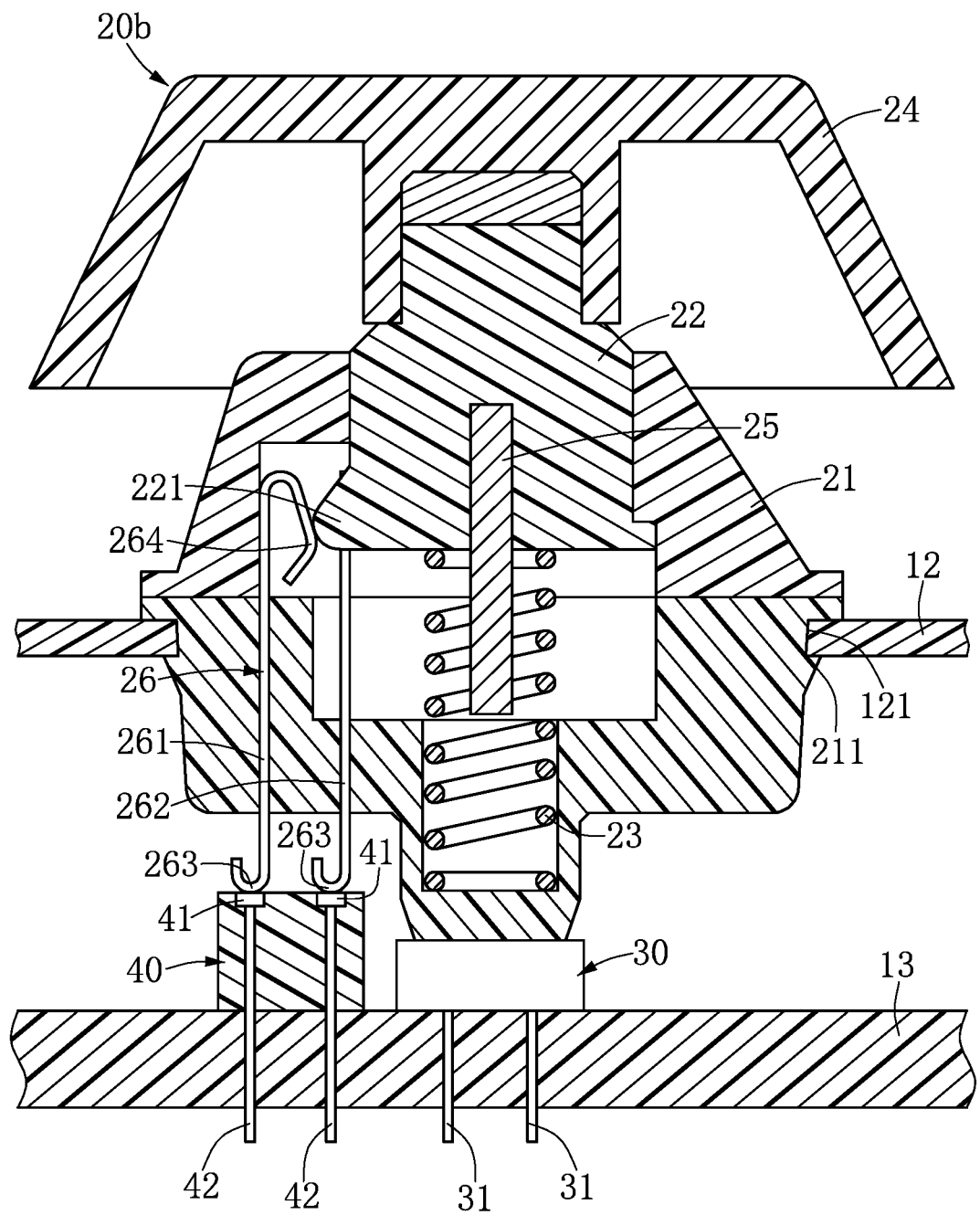
FIG. 6 is an assembled cross-sectional view of the replaceable key structure of the present disclosure, wherein a third key module is disposed in the mounting slot, and the shaft is positioned at the topmost position.
Figure 7:
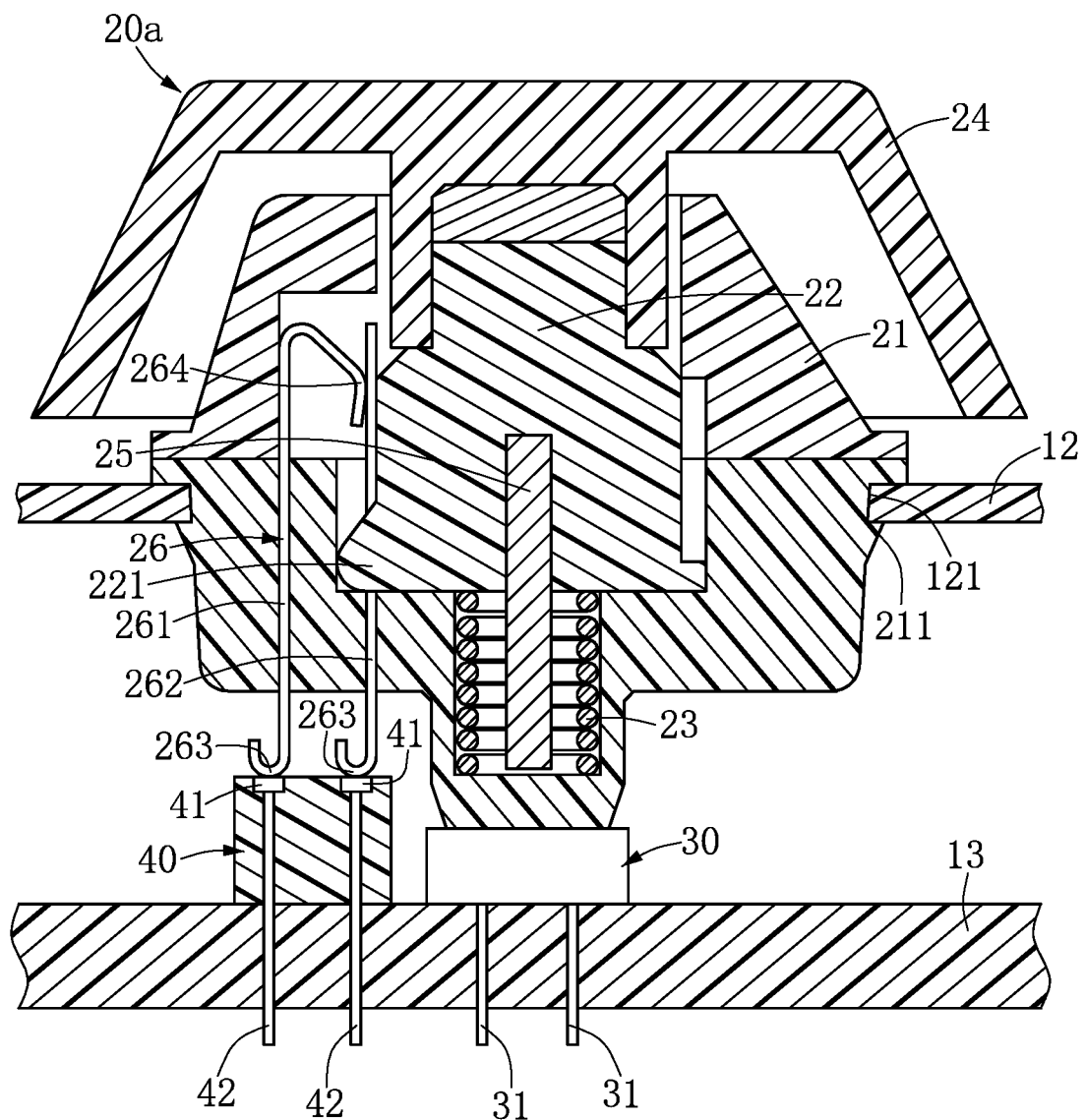
FIG. 7 is an assembled cross-sectional view of the replaceable key structure of the present disclosure, wherein the third key module is disposed in the mounting slot, and the shaft is positioned at the bottommost position.

Reference is made to FIG. 1, FIG. 6 and FIG. 7. The key module 20 of the present disclosure can further provide a third key module 20c, in addition to the first key module 20a and second key module 20b. The third key module 20c is a key module which can simultaneously output an analog signal and a digital signal. In a similar way, the third key module 20c has a key housing 21, a shaft 22, and a spring 23. The top end of the shaft 22 can be assembled with a keycap. The key housing 21 of the third key module 20c has a shape and size matching with that of the mounting slot 121. Sides of the key housing 21 are also provided with a plurality of engaging members 211, so that the third key module 20c is detachably disposed in the mounting slot 121 of the key holder 12.

The third key module 20c has a magnetic element 25 disposed on a bottom end of the shaft 22, and a trigger switch 26 disposed on one side of the shaft 22. The structure and movements of the key housing 21, the shaft 22, the spring 23, the magnetic element 25 and the trigger switch 26 of the third key module 20c are the same as those of the corresponding elements of the first key module 20a and the second key module 20b, and will not be reiterated herein.

Since the third key module 20c has both the magnetic element 25 and the trigger switch 26, the third key module 20c can output an analog signal and a digital signal simultaneously. Therefore, the third key module 20c is suited to situations where both digital and analog control signals are required. Naturally, the third key module 20c can also be set to simultaneously output an analog signal and a digital signal, or only output a digital signal or an analog signal by software, so as to meet the demands of different kinds of software.

In conclusion, the replaceable key structure of the present disclosure has advantages as follows.

First, the replaceable key structure of the present disclosure can provide the first key module 20a disposed in the at least one mounting slot 121 for outputting an analog signal. The strength of the analog signal outputted by the first key module 20a can be changed according to a pressing depth of the keycap 24 by a user, so that the first key module 20a can produce a control signal similar to a pressure controlling key of a gamepad when the user uses a keyboard for control in games or software, which breaks through the restriction of conventional keyboards that only output digital signals.

Further, the replaceable key structure of the present disclosure provides the magnetic sensor 30 and the contact connector 40, which positionally correspond to the at least one mounting slot 121, and the first key module 20a and the second key module 20b are detachably disposed in the mounting slot 121. Therefore, the user can selectively dispose the first key module 20a or the second key module 20b in the at least one mounting slot without the need for a special tool, or even dispose the third key module 20c therein, which allows the present disclosure to have much flexibility in use.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A replaceable key structure, comprising:
   a key holder having a mounting slot formed thereon, the mounting slot is configured to receive a third key module selectively;
   a circuit board disposed under the key holder;
   a magnetic sensor mounted on the circuit board and positionally corresponding to the mounting slot; and
   a contact connector mounted on the circuit board and positionally corresponding to the mounting slot;
   wherein the third key module has a shaft and a spring, the shaft is movable from a topmost position to a bottommost position when an external force is applied, and the shaft is capable of returning to the topmost position by a recovering force of the spring when the external force is removed;
   wherein the third key module has a key housing, sides of the key housing are respectively formed with a plurality of engaging members for fixedly engaging the third key module in the mounting slot;
   wherein the third key module further includes a magnetic element, the magnetic element is connected to a bottom end of the shaft, and the magnetic sensor is positionally corresponding to the magnetic element; when the magnetic element approaches the magnetic sensor following a displacement of the shaft of the third key module, the magnetic sensor outputs an analog signal by inducing a magnetic field of the magnetic element, and a strength of the analog signal is changed following a distance between the magnetic element and the magnetic sensor;
   wherein the third key module includes a trigger switch, the trigger switch is turned on to generate a digital signal when the shaft of the third key module is pushed downward to a triggering position by an external force, wherein the trigger switch has at least one contacting portion disposed on a bottom of the third key module, and the at least one contacting portion is positionally corresponded to the contact connector; when the third key module is disposed in the mounting slot, the contacting portion is capable of contacting the contact connector for transmitting the digital signal to the circuit board.

2. The replaceable key structure according to claim 1, wherein the magnetic element is a post-shaped magnet, a central axis of the magnetic element and a reciprocating direction of the shaft of the first key module are parallel to each other, and the magnetic element is disposed on the bottom end of the shaft; wherein the magnetic sensor is a Hall sensor, and a position of the magnetic sensor on the circuit board corresponds to that of the magnetic element.

3. The replaceable key structure according to claim 1, wherein the trigger switch is disposed on one side of the shaft of the third key module, and has a first electrical terminal and a second electrical terminal, wherein the first electrical terminal has an elastic portion, and the elastic portion is capable of contacting the second electrical terminal so that the trigger switch is in a closed-circuit state; the third key module has a triggering portion disposed on one side of the shaft close to the trigger switch;
   when the shaft of the third key module is positioned at the topmost position, the triggering portion is capable of contacting the elastic portion, and the elastic portion is forced to be divided apart from the second electrical terminal so that the trigger switch is in an open-circuit state;
   when the shaft of the third key module is positioned at the triggering position, the triggering portion is capable of separating from the elastic portion and contacts with the second electrical terminal, so that the trigger switch is in a closed-circuit state.

4. The replaceable key structure according to claim 3, wherein the first electrical terminal and the second electrical terminal respectively have an end extending beyond a bottom of the key housing, and the ends of the first electrical terminal and the second electrical terminal are respectively formed with the contacting portion; wherein the position of the contact connector on the circuit board corresponds to a position of the trigger switch, the contact connector has two circuit contacts positionally corresponded to the contacting portions of the first electrical terminal and the second electrical terminal, respectively, and when the second key module is disposed in the mounting slot, the two contacting portions are capable of contacting the two circuit contacts, so that the trigger switch is electrically connected to the contact connector.

* * * * *